310-334 SR SEARCH ROOM
XR 3,406,350
CROSS REFERENCE

Oct. 15, 1968 W. E. NEWELL 3,406,350

ULTRASONIC AMPLIFIER DEVICE

Filed April 24, 1967

WITNESSES
Edwin E. Bassler
James H. Young

INVENTOR
William E. Newell
BY Gordon H. Telfer
ATTORNEY

United States Patent Office 3,406,350

Patented Oct. 15, 1968

3,406,350

ULTRASONIC AMPLIFIER DEVICE

William E. Newell, Murrysville, Pa., assignor to Westinghouse Electric Corporation, Pittsburgh, Pa., a corporation of Pennsylvania Filed Apr. 24, 1967, Ser. No. 633,275
4 Claims. (Cl. 330—5.5)

ABSTRACT OF THE DISCLOSURE

An ultrasonic amplifier utilizing a body of piezoelectric semiconductor material wherein an output electrical signal can be obtained directly from bunched carriers caused by the local electric field accompanying the propagated ultrasonic wave. The bunched carriers produce conductivity modulation that may be detected by properly placed contact elements.

BACKGROUND OF THE INVENTION

*Field of the invention*

This invention relates generally to ultrasonic amplifier devices comprising a body of piezoelectric semiconductor material wherein ultrasonic waves can be amplified by interacting with carriers whose drift velocity is greater than the velocity of the acoustic wave.

*Description of the prior art*

With respect to ultrasonic amplifier devices of the type generally referred to above, one of the primary priblems of prior art configurations is that there is considerable signal loss associated with the input and output transducers. Ordinary transducers, such as quartz crystals, convert relatively little of the input electrical energy into acoustic energy and relatively little of the amplified acoustic energy is converted back into electrical energy. Therefore it is necessary that the acoustic gain must greatly exceed the useful electrical gain that can be obtained between input and output terminals. Another closely related problem is the difficulty of building conventional transducers into an integral structure with the piezoelectric semiconductor body. In accordance with the prior art, several pieces of separate materials must be fabricated and then bonded together with the bonds creating still more losses and of course the assembly requiring additional expense.

Description of the general type of ultrasonic amplifier device with which this invention relates and examples of prior art configuration is contained in, for example, an article by Hutson, McFee, and White in Physical Review Letters, vol. 7, pp. 237–239, Sept. 15, 1961, and an article by White in Journal of Applied Physics, vol. 33, pp. 2547–2554, Aug. 1962, which should be referred to for further description.

*Summary of the invention*

In the operation of amplifiers of the general type described above, the local electric fields which accompany the ultrasonic wave cause bunching of the mobile electrical carriers, and the charge in the bunches increases as the wave is amplified. In accordance with this invention the output electrical signal can be obtained directly from the bunched carriers instead of indirectly from the ultrasonic wave through a conventional transducer. In particular, this invention provides at the output of the amplifier a pair of ohmic contact elements directly on the body of piezoeletric semiconductor and spaced apart a distance less than the acoustic wavelength of the ultrasonic wave. A constant current is applied across the elements so that the bunched carriers can be detected by means of conductivity modulation that they cause between the ohmic contact elements and the output voltage is thus modulated.

It is also suitable to employ a similar ohmic contact configuration at the input so an applied electric field across the gap causes mechanical strains in the piezoelectric material.

Thus it is possible to have an ultrasonic amplifier in accordance with this invention utilizing a body of piezoelectric semiconductor material that does not require separate transducers to be bonded thereto. Thus it is made possible to avoid the losses inherent in the utilization of separate transducers through their own inefficiency in conversion due to the bonds required between the transducer and the active material.

*Description of the preferred embodiments*

Figures 1, 2, 3:
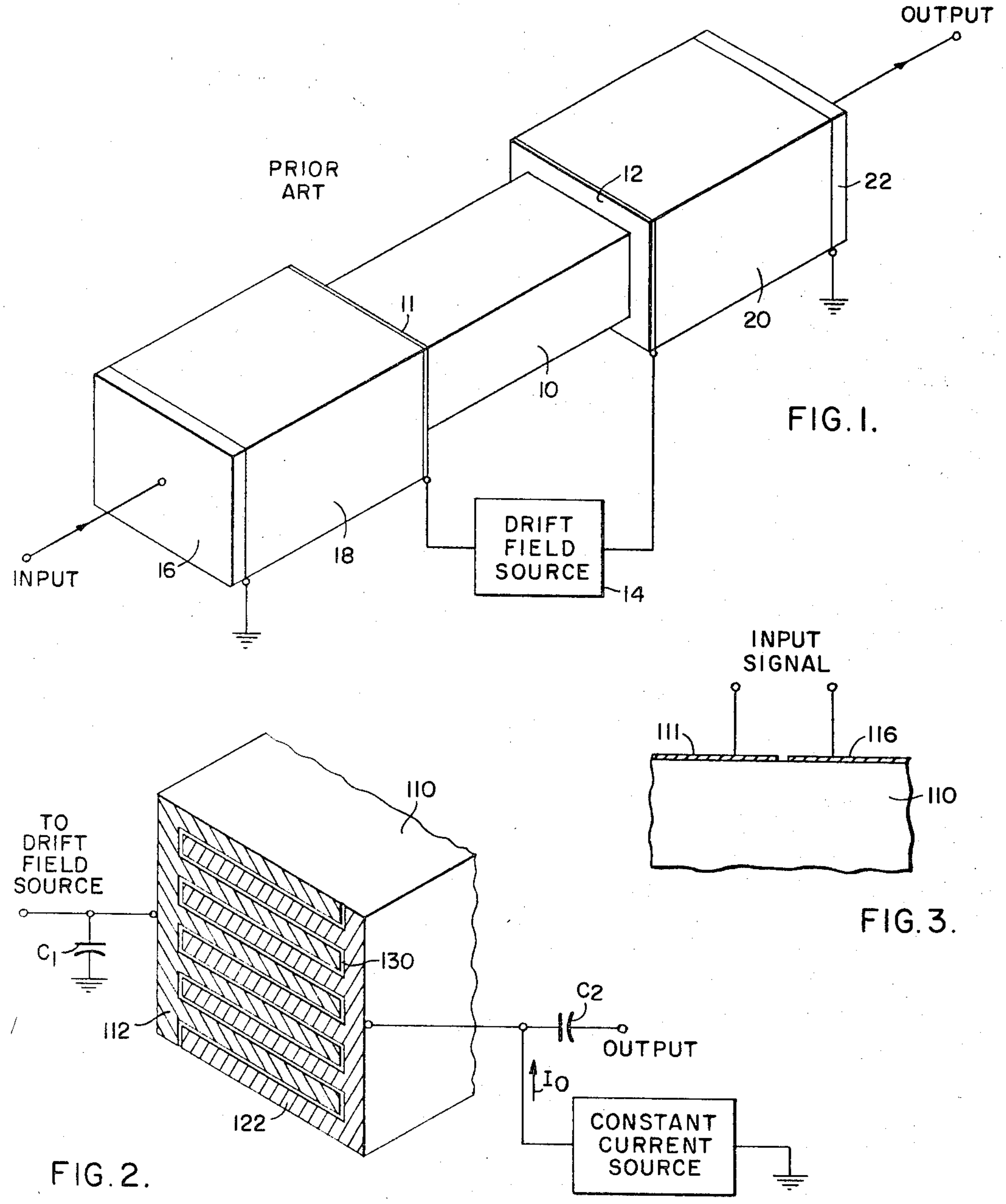
FIG. 1 is a perspective view, partially schematic, of an ultrasonic amplifier in a configuration in accordance with the prior art.
FIGS. 2 and 3 are partial views, FIG. 2 being in perspective and FIG. 3 being in section, of ultrasonic amplifier devices in accordance with this invention particularly showing the improvement provided by this invention.

FIG. 1 shows the basic physical arrangement employed in accordance with the prior art for the amplification of ultrasonic waves utilizing a piezoelectric semiconductor body 10. The semiconductor 10, such as cadmium sulfide, although other II–VI compounds and also III–V compounds, as further examples, may also be used, has applied to its end surfaces ohmic contacts 11 and 12 with leads thereto for connection to a source of direct current voltage, indicated as drift field source 14.

An input transducer 16 converts an applied electrical input signal into an appropriate type of ultrasonic wave that is coupled into the semiconductor 10 by means of a passive buffer element 18. The buffer 18 may be used to isolate the transducer 16 electrically and to introduce a useful time delay for pulsed measurements.

At the output side joined to contact 12 is a second buffer element 20 that couples the amplified ultrasonic wave to an output transducer 22 in which it is reconverted into an electrical signal.

The above-mentioned articles by Hutson and White should be referred for further information to the construction and operation of devices as shown in FIG. 1.

The present invention utilizes the same essential arrangement as illustrated in FIG. 1 except at least one of the transducers and its associated buffer element are avoided by utilization of particular ohmic contact configurations on the semiconductor 10.

The invention is preferably at least applied at the output side of the device. FIG. 2 shows a suitable geometry for a unitary output transducer in accordance with this invention. Onto the end surface of a piezoelectric semiconductor 110, that may be in accordance with prior art materials, are a pair of ohmic contact elements 112 and 122 that are separated by a narrow gap 130. One of the elements 122 is connected to a constant current source so that a constant current, $I_0$, is made to flow across the gap between the element. As bunches of current carriers arrive at the end face they increase the conductivity within the gap between the contact elements, thereby modulating the output voltage.

The resistance of the material between the contact elements, in the gap 130, is determined primarily by the conductivity of the semiconductor 110 to a depth that is approximately equal to the gap width. So that the effect of the conductivity modulation is pronounced the gap should be only a fraction of the acoustic wavelength propagated in the amplifier. For example, the acoustic wavelength of 10 mHz. shear waves in cadmium sulfide is about 7 mils. It would be suitable to employ a contact configuration wherein the gap 130 is about 2 mils wide which would be about a quarter-wavelength. Such a gap may be readily produced using photoresist and etching techniques.

For example, a uniform layer of conductive material could be applied to the face of the semiconductor body 110, a layer of photoresist material applied, exposed, developed to provide an opening in the photoresist material where the gap 130 in the contact configuration is desired. An etchant may be applied to remove the conductive material to provide the desired gap 130. Contact metals, photoresist materials, etchants and other procedures with respect to contact elements 112 and 122 may be in accordance with known technology for forming precise contacts on bodies of semiconductor material.

It is desirable to minimize the output impedance of the amplifier. Since it is known that the output impedance is inversely proportional to the length of the gap it is desirable to provide a long gap length. This is conveniently provided by a configuration of ohmic contact elements wherein each comprises a plurality of interconnected segments and the two elements are disposed with their segments interleaved. The illustrated form of interleaved comb like elements 112 and 122 is merely one example of this form of arrangement. Many types of interleaved, multiple element configurations as known in semiconductor device contacting, such as for base and emitter contacts of relatively high power or relatively high frequency transistors, may be employed in the present invention.

Experiments have been conducted that confirm that a pair of ohmic contact elements spaced apart on the face of a piezoelectric semiconductor body in accordance with this invention may be utilized as a transducer element. To achieve greater efficiency it is desirable that the gap be as narrow as possible and the length of the gap be as long as possible.

FIG. 2 also illustrates that ohmic contact element 112 is connected to the drift field source and that it is also coupled to ground through capacitor C1 that is for the purpose of providing a low impedance path to ground for the signal and a high impedance path for direct current. The other ohmic contact element 122 is that from which the output is derived through the capacitor C2 that is also for the purpose of providing a low impedance signal path and a high impedance to direct current.

While it is found that the practice of the present invention is advantageous in avoiding the necessity of using an output transducer and associated buffer in connection with the ultrasonic amplifier, it is found that it may also be applied at the input and the input transducer and its associated buffer may be avoided. That is, the same type of ohmic contact configuration may be utilized. FIG. 3 illustrates in cross section the general nature of such an arrangement of the input wherein contact elements 111 and 116 are disposed on the end face of piezoelectric semiconductor body 110 to which the input electric signal is applied.

Utilization of this contact configuration as an input transducer means results from the fact that the high electric field across the gap causes mechanical strains in the piezoelectric material. Because of difficulty in avoiding generation of more than one specific type of acoustic wave (for example, shear and longitudinal plane waves)

it may be often preferred to utilize a conventional transducer configuration at the input.

In order to provide a unitary ultrasonic amplifier a contact element configuration such as is shown in FIG. 2 may be utilized at the output and the input transducer may be either the same type or of another suitable type such as a depletion layer transducer as described in an article by White in IRE Transactions on Ultrasonics Engineering, vol. UE-9, pp. 21–27, July 1962, or a diffusion layer transducer as described in an article by Foster in Journal of Applied Physics, vol. 34, pp. 990–991, April 1963. These transducer types are employed directly in the body of the piezoelectric semiconductor and provide suitable input transducer elements. It is expected that a practical one-piece ultrasonic element for use in the range of 10 to 100 mHz. may be provided in accordance with this invention.

In the absence of the drill field source in structures in accordance with this invention they may be used as delay lines without amplification.

While the invention has been shown and described in a few forms only, it will be apparent that numerous modifications may be made without departing from its true scope.

I claim:

1. An ultrasonic device comprising: a piezoelectric semiconductive body; first transducer means for propagating an ultrasonic wave through said body; second transducer means for converting said ultrasonic wave into an electrical signal; said second transducer means comprising a pair of ohmic contact elements directly on said piezoelectric semiconductor body and spaced apart a distance less than the acoustic wavelength of said ultrasonic wave; one of said pair of ohmic contact elements having connected thereto means to apply an electrical current that is influenced by conductivity modulation due to carrier bunching in said body of piezoelectric semiconductor material between said pair of ohmic contact elements to provide a modulated output voltage.

2. The subject matter of claim 1 wherein: means is provided across said body for impressing a direct current voltage in a direction parallel to said ultrasonic wave propagation, said means including the other of said pair of ohmic contact elements.

3. The subject matter of claim 1 wherein: each of said contact elements comprises a plurality of joined segments and segments of each of said ohmic contact elements are interleaved with those of the other.

4. The subject matter of claim 1 wherein: said piezoelectric semiconductor body is of a member selected from the group consisting of compounds of elements of Group III and Group V from the Periodic Table and compounds of elements of Group II and Group VI of the Periodic Table.

References Cited

UNITED STATES PATENTS

| | | | |
|---|---|---|---|
| 3,325,743 | 6/1967 | Blum | 330—5.5 |
| 3,334,307 | 8/1967 | Blum | 330—5.5 |
| 3,343,105 | 9/1967 | Van der Pauw | 333—30 |

OTHER REFERENCES

White et al., "Applied Physics Letters," Jan. 15, 1966, pp. 40–42.

ROY LAKE, *Primary Examiner.*

DARWIN R. HOSTETTER, *Assistant Examiner.*